(12) United States Patent
Li et al.

(10) Patent No.: US 8,030,930 B2
(45) Date of Patent: Oct. 4, 2011

(54) MAGNETIC RESONANCE IMAGING LOCAL COIL COMPOSED OF SEPARATE PARTS

(75) Inventors: Jian Zhong Li, Shenzhen (CN); Yan Hong Chen, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 252 days.

(21) Appl. No.: 12/361,716

(22) Filed: Jan. 29, 2009

(65) Prior Publication Data
US 2009/0189610 A1 Jul. 30, 2009

(30) Foreign Application Priority Data
Jan. 29, 2008 (CN) .......................... 2008 1 0005204

(51) Int. Cl.
*G01V 3/00* (2006.01)

(52) U.S. Cl. ...................................... 324/322; 324/318

(58) Field of Classification Search .......... 324/300–322; 600/410–435
See application file for complete search history.

(56) References Cited

U.S. PATENT DOCUMENTS

| 5,489,847 | A  | * | 2/1996  | Nabeshima et al. | 324/318 |
|-----------|----|---|---------|------------------|---------|
| 5,664,568 | A  | * | 9/1997  | Srinivasan et al.| 600/422 |
| 6,501,274 | B1 | * | 12/2002 | Ledden           | 324/318 |
| 6,577,888 | B1 | * | 6/2003  | Chan et al.      | 600/422 |
| 6,784,665 | B1 | * | 8/2004  | Chan et al.      | 324/318 |
| 7,012,429 | B1 | * | 3/2006  | Ledden           | 324/318 |
| 7,345,481 | B2 | * | 3/2008  | Leussler         | 324/318 |
| 7,375,527 | B2 | * | 5/2008  | Vaughan, Jr.     | 324/318 |
| 7,659,719 | B2 | * | 2/2010  | Vaughan et al.   | 324/318 |

* cited by examiner

*Primary Examiner* — Dixomara Vargas
(74) *Attorney, Agent, or Firm* — Schiff Hardin LLP

(57) ABSTRACT

A separated coil for a magnetic resonance imaging system has a first partial coil in a first partial casing and a second partial coil in a second partial casing, the first and second partial coils being connected to a connector for connection to the imaging system via a first cable and a second cable, respectively. The coil also has a coupler having a first part disposed in the first partial casing and connected to the first partial coil, and a second part, coupled to the first part, disposed in the second partial casing. The first cable is disposed in the second partial casing, and the second part of the coupler is connected to the connector for connection to the imaging system via the first cable. The signals in the first partial coil are coupled and connected to the cable and the connector via the coupler.

6 Claims, 3 Drawing Sheets

MAGNETIC RESONANCE IMAGING LOCAL COIL COMPOSED OF SEPARATE PARTS

BACKGROUND OF THE INVENTION

1. Field of the Invention

The present invention relates to a magnetic resonance imaging system and, in particular to a local coil for a magnetic resonance imaging system of the type composed of two separate coil parts.

2. Description of the Prior Art

In a magnetic resonance imaging (MRI) system, due to the application needs, some coils often comprise two parts separated from each other, such as a head-coil and a knee-coil, since there are usually two application needs in clinical practice, namely, the upper and lower parts of a head-coil are used together or the lower part thereof is used alone. Such coils usually are composed of two parts separated from each other. Under normal circumstances, the two parts of the coil which are separated from each other are each located in their own coil casings (housings) respectively.

In the present invention, for a simple description, the two parts of a separate type coil (the upper and lower two parts or the left and right two parts or two parts of other shapes) are referred to as the first partial coil and the second partial coil respectively. Accordingly the coil casing for the first partial coil to fit in is referred to as the first partial casing, the coil casing for the second partial coil to fit in is referred to as the second partial casing. FIG. 1a is an illustration of a separate type coil according to the prior art, and as shown in FIG. 1a, the separate type coil has a first partial coil 12 in the first partial casing 11 and a second partial coil 22 in a second partial casing 21. The second partial coil 22 is connected to a connector 24 for connecting to the imaging system via a second cable 23 which is disposed in the second partial casing 21. In FIG. 1a, assuming that the first partial coil 12 and the second partial coil 22 of the separate type coil comprise three coil units respectively, each coil unit corresponds to a cable. When the first partial coil 12 and the second partial coil 22 of the separate type coil are used together, in order to enable the correct output of the signals from the first partial coil 12, in FIG. 1a, the first cable 13 of the first partial coil 12 is disposed in the first partial casing 11, and the first cable 13 is connected to the connector 14 for connecting to the imaging system. Three coil units of the first partial coil 12 each lead to a cable 13 respectively from the first partial casing 11, the leading cables 13 are connected to the connector 14, and the signals of the first partial coil 12 are outputted to the imaging system for constructing images via the cables 13 and the connector 14. In this method, since the cable 13 and the connector 14 of the first partial coil 12 need to take up additional space, it is not convenient in use.

FIG. 1b is an illustration of another separate type coil according to the prior art, in FIG. 1b, the cables 13 and the connector 14 of the first partial coil 12 are disposed in the second partial casing 21, and the signals of the first partial coil 12 are connected to the cables 13 and the connector 14 in the second partial casing 21 by a metal sheet. As shown in FIG. 1b; the metal sheet is also divided into the upper and lower two parts, a first part 15 and a second part 25 of the metal sheet, wherein, the first part 15 of the metal sheet is located in the first partial casing 11, and connected to the first partial coil 12, the second part 25 of the metal sheet is located in the second partial casing 21, and connected to the connector 14 via the cable 13 in the second partial casing 21. The connector 24 connected to the metal sheet 25 and the connector 24 connected to the second partial coil 22 can be arranged side by side together, like the connector 4 shown in FIG. 1b. However, in this method, as the coil is used over time, the surface of the metal sheet will be rusted or contaminated, thereby causing imperfect electric contacts, in addition, when the second partial coil 22 is used alone, the second part 25 of the uncovered metal sheet will also cause some potential safety problems to a patient.

SUMMARY OF THE INVENTION

In order to solve the above problems, the present invention provides a separate type coil to ensure the reliability of the electrical connections in a magnetic resonance imaging system.

The separate type coil for a magnetic resonance imaging system in accordance with the present invention has a first partial coil in a first partial casing and a second partial coil in a second partial casing, the first partial coil and the second partial coil being connected to a connector for connection to the imaging system via a first cable and a second cable, respectively. In addition, the separate type coil also has a coupler, this coupler having a first part and a second part that are coupled to each other. The first part of the coupler is disposed in the first partial casing and is connected to the first partial coil, the second part of the coupler is disposed in the second partial casing. The first cable is disposed in the second partial casing, and the second part of the coupler is connected to the connector for connection to the imaging system via the first cable.

Preferably, the first partial coil is formed as at least one coil unit, and each coil unit corresponds to a coupler.

Preferably, the coupler is an inductive coupler.

Preferably, an equivalent circuit of each coil unit in said first partial coil and the coupler includes a coil unit inductance, a capacitance assembly for adjusting the performance criteria of the coil unit, two parts of mutually coupled inductance of the coupler, and a detuning loop for the coil unit and an amplifier. One side of said capacitance assembly is connected to the coil unit inductance, the other side of the capacitance assembly is connected to the first part of the mutually coupled inductance of the coupler. One side of the detuning loop is connected to the second part of the mutually coupled inductance of the coupler. The other side of the detuning loop is connected to said amplifier. The other side of the amplifier is used for connecting with the first cable.

The coil unit inductance, the capacitance assembly for adjusting the performance criteria of the coil unit, and the first part of the mutually coupled inductance of the coupler can be disposed in the first partial casing, the second part of the mutually coupled inductance of the coupler. The detuning loop and the amplifier can be disposed in the second partial casing.

Preferably, the shape of the first part and the second part of the mutually coupled inductance of the coupler is butterfly-shaped.

Preferably, the separate type coil is a head-coil or a knee-coil.

It can be seen from the above solution that, in the present invention, the first cable for outputting the first partial coil signals is disposed in the second casing, and the coupler is disposed between the first partial casing and the second partial casing, the first part of the coupler is connected to the first partial coil, the second part of the coupler is connected to the connector for connecting to the imaging system via the first cable disposed in the second partial casing, the signal in the first partial coil couple and connect to the first cable and the connector in the second partial casing via the coupler, so as to avoid any imperfect electric contact and potential safety problems due to metal connections.

DESCRIPTION OF THE PREFERRED EMBODIMENTS

In order to make the objects, technical solutions and advantages of the present invention more apparent, the present invention will be further described in detail below with reference to the accompanying drawings and embodiments.

Figure 1A:
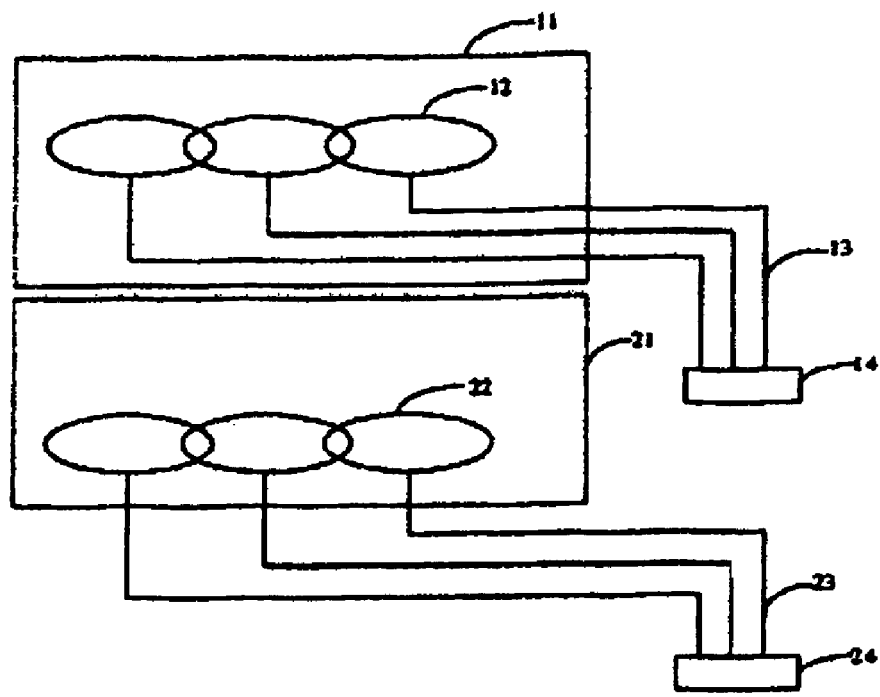
FIG. 1a and FIG. 1b are structural diagrams of two types of separate type coils in the prior art.
Figure 1B:
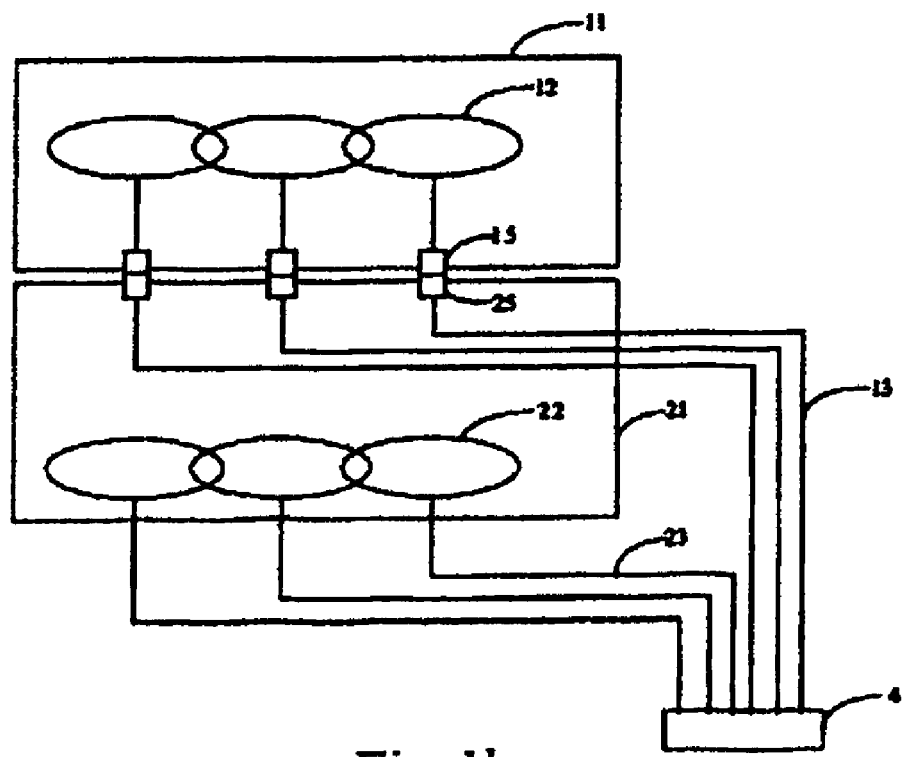
Figure 2:
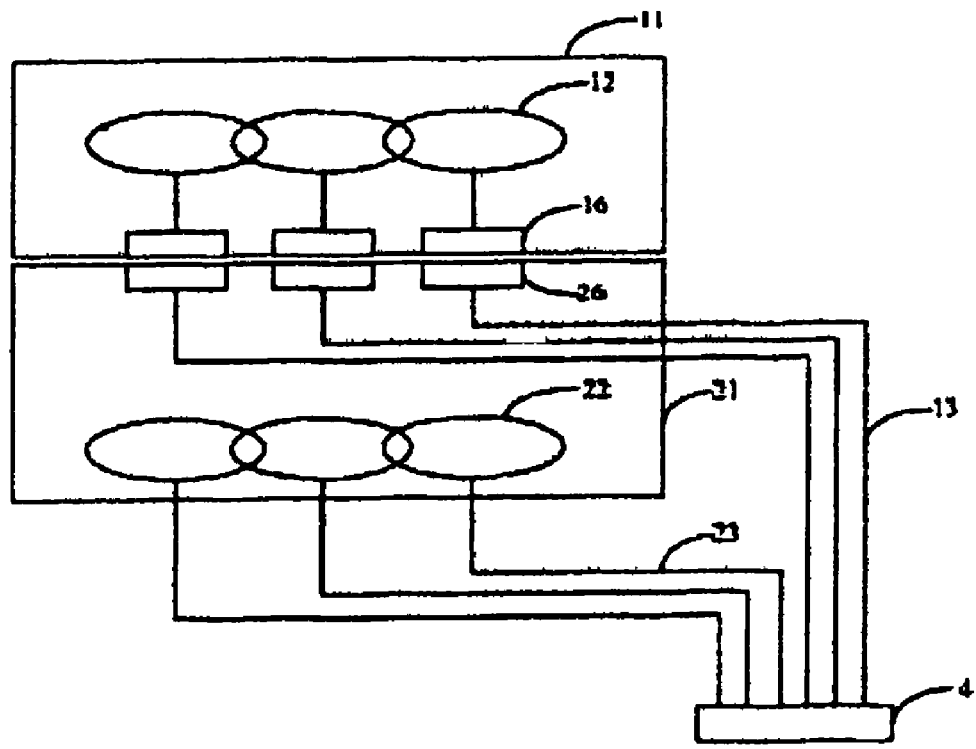
FIG. 2 is a diagram of a separate type coil of an embodiment according to the present invention.

Referring to FIG. 2, FIG. 2 is a diagram of a separate type coil of an embodiment according to the present invention. In this embodiment of the present invention, in order to avoid the imperfect electric contacts and potential safety problems due to metal connections, the signals of the first partial coil 12 can be coupled and connected to the first cable 13 in the second partial casing 21 and to the connector 4 for connecting to the system via the coupler. Two parts of the coupler to be coupled to each other are disposed in the first partial casing 11 and the second partial casing 21 respectively, in order to facilitate the description, the two parts of the coupler to be coupled to each other can be referred to as the first part 16 and the second part 26 respectively. The first part 16 of the coupler can be disposed in the first partial casing 11 and connected to the first partial coil 12, the second part 26 of the coupler is disposed in the second partial casing 21 and connected to the connector 4 for connecting to the imaging system via the first cable 13 in the second partial casing 21. In this way, when the two parts of the coil are used together, the signals of the first partial coil 12 can be transmitted to the first cable 13 and the connector 4 in the second partial casing 21 via the coupler, so as to finally enter the system for imaging, thus avoiding the imperfect electric contact and potential safety problems due to two part metal connections.

Usually, the first partial coil 12 and the second partial coil 22 comprise at least one coil unit respectively, so a coil unit of the first partial coil 12 corresponds to a coupler.

Figure 3:
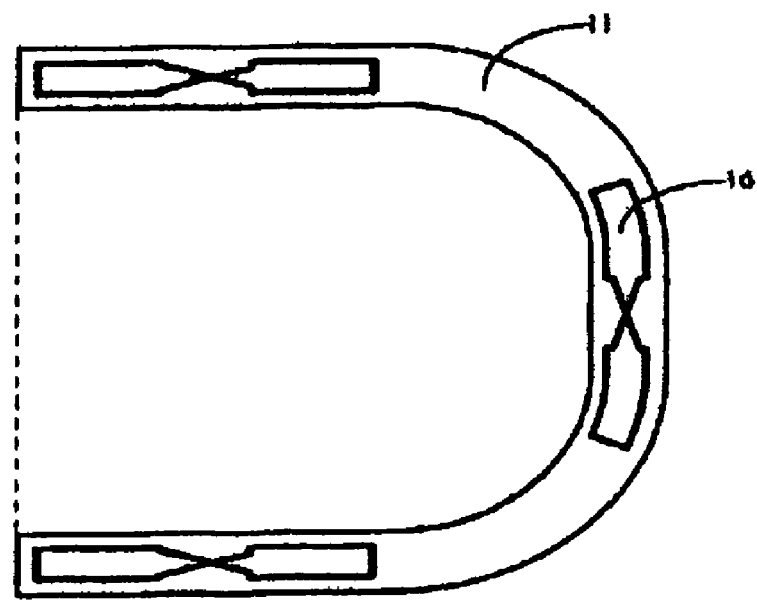
FIG. 3 is a diagram of a head-coil's coupler of an embodiment according to the present invention.

For the placement of the coupler, it can be placed evenly, and tests have shown that a butterfly-shaped coupler can be used in order to effectively reduce the coupling effects between the coupler and the coil unit, namely, the shape of the first part 16 and the second part 26 of the coupler are both butterfly-shaped. Particularly, taking a head-coil as an example, assuming that the first partial coil 12 of the head-coil has three coil units. In the upward-looking view angle of the first partial casing 11 of the head-coil as shown in FIG. 3, three uniformly distributed butterfly-shaped first parts 16 of the coupler can be disposed. Similarly, for the downward-looking view angle of the second partial casing 21 of the head-coil as shown in FIG. 3, three uniformly distributed butterfly-shaped second parts 26 of the coupler which correspond to three uniformly distributed butterfly-shaped first parts 16 of the coupler can be obtained. In which case a coil unit corresponds to a coupler.

In the embodiment, the coupler can be an inductive coupler, and it can also be a capacitive coupler. Take the inductive coupler as an example, in order to meet the requirements of signal-to-noise ratio loss, the relevant parameters of the coupler can be predetermined, including the coupling coefficient Km, the equivalent impedance Xm, and so on, and then the coupler which meets the signal-to-noise ratio loss requirements is determined according to the determined relevant parameters of the coupler.

Figure 4A:
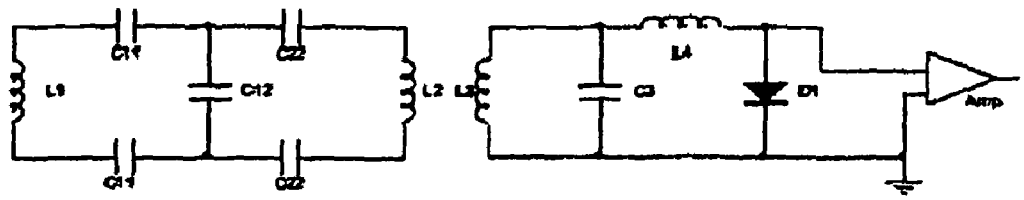
FIG. 4a to FIG. 4d are parameter design flow charts of a coil coupler of an embodiment according to the present invention.

FIGS. 4a to 4d are parameter design flow charts of a coil coupler of an embodiment according to the present invention. As shown in FIG. 4a, FIG. 4a is a coil unit circuit diagram of the first partial coil with an inductive coupler of the embodiment according to the present invention. An equivalent electric circuit of each coil unit and the coupler comprises: a coil unit inductance, a capacitance assembly for adjusting performance criteria of the coil unit, two parts of mutually coupled inductance of the coupler, a detuning loop of the coil unit and an amplifier. One side of the capacitance assembly is connected to the coil unit inductance, the other side is connected to a partial inductance to be mutually coupled to the coupler; one side of the detuning loop is connected to the other partial inductance to be mutually coupled to the coupler, the other side of the detuning loop is connected to the amplifier, and the other side of the amplifier is used for connecting with the first cable 13.

In FIG. 4a, an inductor L1 is the coil unit inductance; two capacitors C11, a capacitor C12, two capacitors C22 are an I-shaped capacitor assembly, wherein, two capacitors C11 are used for adjusting the frequency of the coil unit, the capacitor C12 is used for adjusting the matching between the coil units, two capacitors C22 are used for adjusting the phase of the coil unit; the inductors L2, L3 are two parts of mutually coupled inductance of the coupler, a capacitor C3, an inductor L4 and a diode D1 is the detuning loop of said coil unit; and an amplifier (Amp) behind the detuning loop is used for pre-amplification of the signals, then the amplified signals are outputted via the cable 13.

The connection relationship of each component is as follows. One end of the capacitor C12 is connected to one end of the capacitor C11 and one end of the capacitor C22, the other end of the capacitor C12 is connected to one end of the other capacitor C11 and one end of the other capacitor C22, the other ends of the two capacitors C11 are connected to both ends of the inductor L1, respectively. The other ends of two capacitances C22 are connected to both ends of the inductor L2 respectively; the inductor L2 is coupled and connected to the inductor L3; one end of the inductor L3 is connected to one end of the capacitor C3 and one end of the inductor L4. The other end of the inductor L3 is connected to the other end of the capacitor C3, one end of the diode D1, one input end of the amplifier and ground. The other end of the inductor L4 is connected to the other end of the diode D1 and one input end of the amplifier.

In FIG. 4a, L2 and the part of the circuit to its left are disposed in the first partial casing 11, and L3 and the part of the circuit to its right are disposed in the second partial casing 21.

Figure 4B:
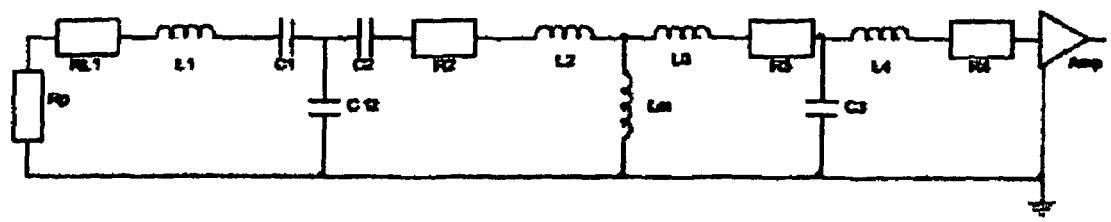

Based on the circuit shown in FIG. 4a, in order to facilitate the analysis, the circuit shown in FIG. 4a can be made equivalent to the circuit shown in FIG. 4b. The patients' impedance Rp is taken into consideration, and the inductor L1 is equivalent to pure inductance L1 and impedance RL1; the I-shaped circuit formed by two C11s, two C22s and one C12 is made equivalent to the T-shaped circuit formed by one C1, one C2 and one C12. The inductor L2 is made equivalent to pure inductance L2 and impedance R2, the inductor L3 is made equivalent to pure inductance L3 and impedance R3. The coupler formed by the inductors L2, L3 shown in FIG. 4a is made equivalent to a T-shaped coupler shown in FIG. 4b. Lm in the T-shaped coupler is the equivalent inductance produced by the coupling of the coupler. In addition, the inductor L4 is made equivalent to pure inductance L4 and impedance R4.

Figure 4C:
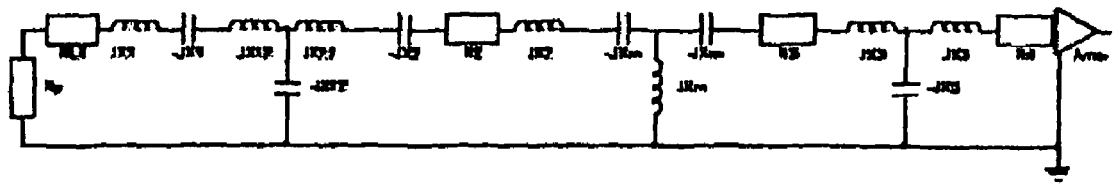

Furthermore, in order to facilitate the calculation, FIG. 4b can be simplified, so as to obtain a simplified circuit as shown in FIG. 4c, wherein JX1 is the inductive reactance of the inductor L1, −JX1 is the capacitive reactance of the capacitor C1. A 90-degree T-shaped phase shifter is formed by the two inductive reactance elements JX12 and the capacitive reactance −JX12. −JX12 is the capacitive reactance of the capacitor C2; JX2 is the inductive reactance of the inductor L2. A −90-degree T-shaped phase shifter is formed by the two capacitive reactance elements −JXm and the inductive reactance JXm. JX3 is the inductive reactance of the inductor L3. JX3 is also the inductive reactance of the inductor L4, −JX3 is the capacitive reactance of the capacitor C3, and a 90-degree T-shaped phase shifter is formed by two JX3 and −JX3.

Figure 4D:

Furthermore, positive and negative items of the same absolute value shown in FIG. 4c cancel one another out, and a simplified circuit as shown in FIG. 4d is obtained. In FIG. 4d, R1 represents the sum of RL1 and Rp; X12 represents a 90-degree T-shaped phase shifter formed by the two inductive reactance elements JX12 and the capacitive reactance −JX12. Xm represents a −90-degree T-shaped phase shifter formed by the two capacitive reactance elements −JXm and inductive reactance element JXm. X3 represents a 90-degree T-shaped shifter formed by two JX3 and −JX3. R2, R3 and R4 from FIG. 4b to FIG. 4d are the same.

By way of analysis and calculations based on the above circuit shown in FIG. 4a to FIG. 4d, the following question can be obtained:

$$\frac{\Box SNR}{SNR} = \sqrt{\frac{1}{Km^2 \cdot \frac{JX2}{R2} \cdot \frac{JX3}{R3}} + \frac{1}{\frac{JX3}{R3} \cdot \frac{JX4}{R4}}}$$

wherein $\frac{\Box SNR}{SNR}$ is a predetermined signal-to-noise ratio loss threshold, JX2 is the inductive reactance of the inductor L2, R2 is the impedance of the inductor L2, JX3 is the inductive reactance of the inductor L3, R3 is the impedance of the inductor L3, R4 is the impedance of the inductor L4, Km is coupling coefficient of the coupler, by calculating the above formula, Km value can be obtained.

According to the Km value and the relationship between Km and the coupling equivalent inductance Lm, Lm=Km·$\sqrt{L2 \cdot L3}$, so as to determine the value of coupling equivalent inductance Lm of the couplers, wherein, L2, L3 are respectively the inductance values of the two inductors that constitute the coupler.

According to the values for Lm and the coil's operating frequency ω, the equivalent impedance Xm of the coupler can be calculated, namely Xm=Lm·ω. The inductance values of the two parts of the coupler are thereby determined.

After having determined the above parameters, in order to ensure the application requirements are met, it can further adjust the equivalent impedance of a 90-degree T-shaped phase shifter formed by the two inductive reactance elements JX12 and the capacitive reactance −JX12 in a coil unit of the first partial coil according to the Xm value, as shown in the following equation:

$$X12 = \sqrt{R1 \cdot Xm \cdot \sqrt{\frac{R2}{R3} + \frac{R4}{R3} \cdot \frac{Xm^2}{X3^2}}}$$

The value of X12 can be obtained by calculation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A separate type coil for a magnetic resonance imaging system, comprising:
    a first partial coil in a first partial casing and a second partial coil in a second partial casing, said first partial coil and said second partial coil being connected to a connector for connection to the imaging system via a first cable and a second cable, respectively;
    An inductive coupler comprising a first part and a second part that are coupled to each other, the first part of the coupler being disposed in the first partial casing and being connected to said first partial coil, the second part of said coupler being disposed in the second partial casing, said first cable being disposed in the second partial casing, and the second part of said coupler being connected to the connector for connection to the imaging system via said first cable; and
    an equivalent circuit of each coil unit in said first partial coil and the coupler comprising: a coil unit inductance, a capacitance assembly for adjusting the performance criteria of the coil unit, two parts of mutually coupled inductance of the coupler, a detuning loop for the coil unit and an amplifier with one side of said capacitance assembly being connected to said coil unit inductance, the other side of said capacitance assembly being connected to the first part of the mutually coupled inductance of the coupler, one side of said detuning loop being connected to the second part of the mutually coupled inductance of the coupler, the other side of said detuning loop being connected to said amplifier, and the other side of the amplifier being used for connection with the first cable.

2. The separate type coil as claimed in claim 1, wherein said first partial coil comprises at least one coil unit, and each coil unit corresponds to a coupler.

3. The separate type coil as claimed in claim 1, wherein said coil unit inductance, the capacitance assembly for adjusting the performance criteria of the coil unit, and the first part of the mutually coupled inductance of the coupler are disposed in the first partial casing, and the second part of the mutually coupled inductance of the coupler, the detuning loop and the amplifier are disposed in the second partial casing.

4. The separate type coil as claimed in claim 1, wherein the first part and the second part of the mutually coupled inductance of the coupler in combination, are butterfly-shaped.

5. The separate type coil as claimed in claim 1 wherein said first partial coil in said first partial casing and said second partial coil in said second partial casing, and said coupler, are configured to form a head coil.

6. The separate type coil as claimed in claim 1 wherein said first partial coil in said first partial casing and said second partial coil in said second partial casing, and said coupler, are configured to form a knee coil.

* * * * *